United States Patent
Van Roijen et al.

(10) Patent No.: US 6,933,559 B1
(45) Date of Patent: Aug. 23, 2005

(54) LDMOS WITH GUARD RING (OF SAME TYPE AS DRAIN) SURROUNDING THE DRAIN

(75) Inventors: Raymond Van Roijen, Nijmegen (NL); Johannes Hendrik Hermanus Alexius Egbers, Nijmegen (NL); Adrianus Willem Ludikhuize, Eindhoven (NL); Anco Heringa, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 133 days.

(21) Appl. No.: 09/663,593

(22) Filed: Sep. 18, 2000

(30) Foreign Application Priority Data

Sep. 16, 1999 (EP) ............................................. 99203019

(51) Int. Cl.[7] .............................................. H01L 29/78
(52) U.S. Cl. ....................... 257/328; 257/336; 257/344; 257/408
(58) Field of Search .................................. 257/328, 336, 257/506, 525, 526, 578, 596, 344, 408, 487–493, 496

(56) References Cited

U.S. PATENT DOCUMENTS

| | | | | |
|---|---|---|---|---|
| 3,538,398 A | | 11/1970 | Whiting ...................... 317/235 |
| 5,146,298 A | * | 9/1992 | Eklund ........................ 257/378 |
| 5,578,859 A | * | 11/1996 | Wondrak et al. ............. 257/492 |
| 5,629,558 A | * | 5/1997 | Galbiati et al. .............. 257/653 |
| 5,940,700 A | | 8/1999 | Galbiati et al. .............. 438/237 |
| 6,211,551 B1 | * | 4/2001 | Suzumura et al. ........... 257/343 |

FOREIGN PATENT DOCUMENTS

| | | | |
|---|---|---|---|
| EP | 0514060 A2 | 11/1992 | |
| JP | 10321842 A | * 12/1998 | |
| WO | WO 8300776 A | * 3/1983 | ........... H01L/29/91 |
| WO | 8503807 A1 | 8/1985 | |

* cited by examiner

Primary Examiner—Minhloan Tran
Assistant Examiner—Thomas L Dickey
(74) Attorney, Agent, or Firm—Peter Zawilski

(57) ABSTRACT

In high-voltage devices comprising a lightly doped region (3) provided with a heavily doped contact zone 4, damage caused by local breakdown at the corner of the contact zone may occur as a result of the Kirk effect at a high current density. To improve the robustness of the device, an annular protection zone (14) of the same conductivity type is provided so as to surround the contact zone at a small distance. As a result, breakdown will occur initially at the corner of the protection zone. However, due to the resistance between the protection zone and the contact zone, a more uniform current distribution is obtained, which prevents damage caused by local current concentration.

10 Claims, 2 Drawing Sheets

LDMOS WITH GUARD RING (OF SAME TYPE AS DRAIN) SURROUNDING THE DRAIN

BACKGROUND OF THE INVENTION

The invention relates to a semiconductor device comprising a semiconductor body having a first region of a first conductivity type and, adjacent thereto, a second region of the second, opposite, conductivity type, a third region of the first conductivity type, which is adjacent the second region and separated from the first region by the second region, and a fourth region of the first conductivity type which is separated from the second region by the third region and which has a higher doping concentration than the third region, the first, the second and the fourth region each being provided with a terminal. Said fourth region may be considered to be a contact zone of the third region of the same conductivity type. Consequently, the succession of various regions described herein forms a horizontal or a vertical npn or pnp structure which can suitably be used, for example, as a transistor (bipolar or MOS) or as a diode.

It has been found that, in practice, such elements often are vulnerable to damage when, during operation, a high voltage is applied in the reverse direction across the pn-junction between the second region and the fourth region while, at the same time, there is a large current flow. This damage may be caused by a local current concentration as a result of a breakdown, leading to a local increase in temperature and causing the field to increase at the junction from region 3 to region 4, which may lead to a further current increase. It is well known that an increase of the breakdown voltage, for example, in the third region can be achieved by providing electrically floating rings or zones of the opposite conductivity type at the edges of the second region, leading to a reduction of the electric field. As the conductivity type of these zones is contrary to that of the third region, the provision of these zones requires an additional process step. Besides, these rings take up comparatively much space, leading to an increase in the size of the circuit element, which may be inconvenient particularly in integrated circuits. It is also possible that this measure results in an increase of the series resistance of the element. A further drawback of this measure resides in that an increase of the electric field strength and current concentration at the junction between the third and the fourth region is suppressed hardly, or not at all.

SUMMARY OF THE INVENTION

The invention, inter alia, aims at providing an effective way of precluding damage caused by current concentration and field increase without additional process steps. To achieve this, a semiconductor device of the type mentioned in the opening paragraph is characterized in accordance with the invention in that the third region is provided with a protection zone of the first conductivity type having a higher doping concentration than the third region, which protection zone is separated from the second region by the third region and is situated near the fourth region, and separated from said fourth region by an intermediate, comparatively high-impedance region of the third region. The invention is based, inter alia, on the recognition that a cutoff voltage across the pn-junction at a high current density may lead to the Kirk effect, causing the maximum of the electric field strength to be displaced from the pn-junction to the contact zone as a result of the current. The current responsible for the Kirk effect may originate from the first region due to parasitic npn or pnp action. For example, the curvature of the contact zone or local irregularities in the diffusion front of the contact zone may cause local peaks in the field strength which are responsible for said current concentration upon breakdown and the associated damage. By the provision near the contact zone, but separated therefrom by high-impedance material of the third region, of a heavily doped zone of the same conductivity type, for example in the form of a ring around the contact zone, it is achieved that the above-described Kirk effect initially occurs along the edge of the protection zone. As a high-impedance region which forms a resistance in the current path is situated between the protection zone and the contact zone, current concentration upon breakdown will be precluded or at least substantially suppressed. As will be described hereinafter, the protection zone and the contact zone can generally be formed simultaneously, so that additional process steps are not necessary. In addition, the protection zone hardly takes up additional space, so that there is no, or hardly any, increase in the size of the device.

An embodiment of a semiconductor device in accordance with the invention is characterized in that the third region is formed by a surface region of the first conductivity type adjoining a surface of the semiconductor body, the fourth region and the protection zone being provided as adjacent surface zones of the first conductivity type. Although the invention can also be applied in lateral configurations, particular advantages are obtained when it is applied in vertical configurations. A semiconductor device in accordance with the invention having a vertical structure is characterized in that the third region is bounded, at the side opposite the surface, by the second region of the second conductivity type, and the first region of the first conductivity type is formed by a region which, viewed from the surface, is situated below the second region. An embodiment which is particularly suited for use in integrated circuits is characterized in that the third region is formed by an island-shaped part of an epitaxial layer which is provided on a substrate of the second conductivity type, said first region and said second region being formed by, respectively, a buried layer of the first conductivity type and a buried layer of the second conductivity type, said buried layers being arranged one above the other between the epitaxial layer and the substrate, the second buried layer of the second conductivity type isolating the epitaxial layer and the first buried layer of the first conductivity type from each other, and said second buried layer being isolated from the substrate of the second conductivity type by the first buried layer. A further embodiment is characterized in that the island-shaped part of the first conductivity type and the buried layer of the second conductivity type form a diode which serves as a circuit element in an integrated circuit. The diode can be advantageously used, for example, to protect the circuit against damage caused by electrostatic discharge (ESD).

These and other aspects of the invention will be apparent from and elucidated with reference to the embodiments described hereinafter.

DESCRIPTION OF THE PREFERRED EMBODIMENTS

Figure 1:
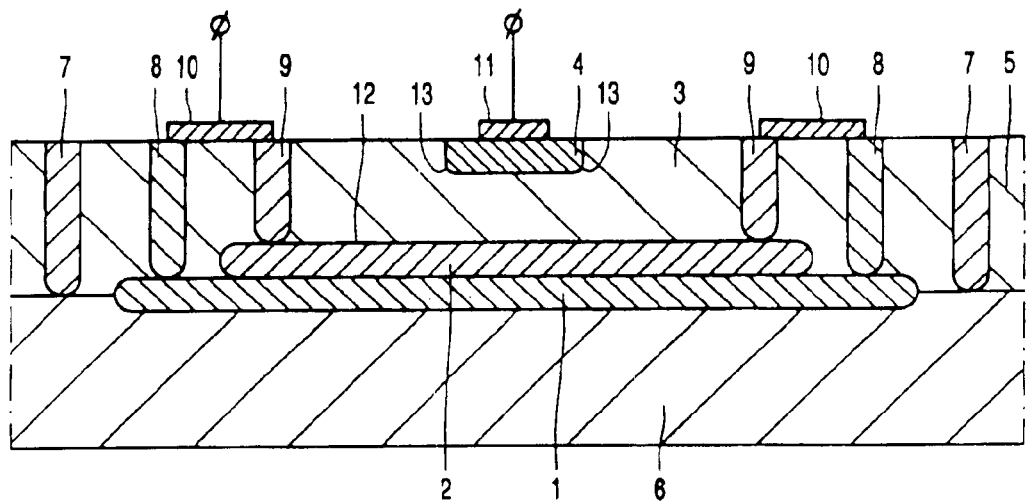
FIG. 1 is a sectional view of a semiconductor device which is known per se.
Figure 2:
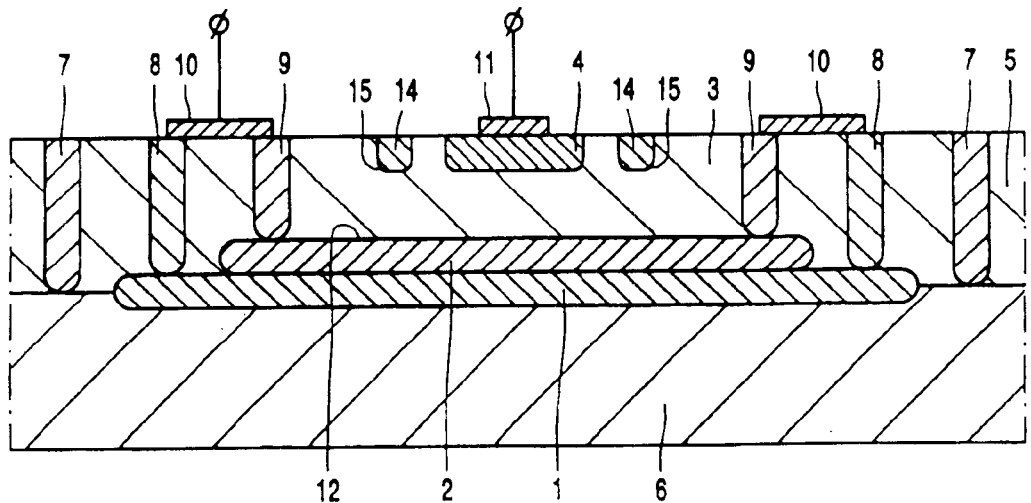
FIG. 2 is a sectional view of a semiconductor device in accordance with the invention.

It is to be noted that the drawings are only diagrammatic and not to scale. Hereinbelow, the invention will be described by means of a diode which can suitably be used, for example, as a protection diode against ESD in an integrated circuit. To illustrate the invention, FIG. 1 shows a known diode and FIG. 2 shows an embodiment of such a diode in accordance with the invention. The device comprises a semiconductor body provided with: a first region 1 of a first conductivity type, in this example the n-type, a second region of the second, opposite conductivity type, i.e. in this example the p-type, which adjoins the first region 1, a third region 3 of the n-type adjoining the second region 2 and separated from the first region 1 by the second region, and a fourth region 4 of the n-type adjoining the third region 3, which fourth region forms a contact zone and has a higher doping concentration than the third region 3. The region 3 is formed by an island-shaped part of an n-type epitaxial layer 5 of silicon, which is provided on a p-type silicon substrate 6. Within the epitaxial layer, the island 3 is electrically insulated by a deep p-type zone 7 which extends right across the thickness of the layer 5. The first region 1 and the second region 2 are formed, respectively, by an n-type buried layer and a p-type buried layer, which are provided at the interface between the epitaxial layer 5 and the substrate 6. The n-type buried layer 1 forms an electrical isolation between the p-type buried layer 2 and the p-type substrate 6, while the p-type buried layer 2 forms an isolation between, on the one hand, the n-type buried layer 1 and, on the other hand, the n-type island 3 and the n-type contact zone 4. The buried zones 1 and 2 are provided with, respectively, a deep n-type contact zone 8 and a deep p-type contact zone 9. The zones 8 and 9 are provided with a common terminal 10 which forms the anode of the diode. The zone 4 is connected to a metal contact 11 which forms the cathode.

In an actual embodiment, the thickness of the epitaxial layer 5 was approximately 9 $\mu$m, and the doping concentration was $3.5 \times 10^{15}$ atoms per cm$^3$. The depth of the n-type contact zone 4 was approximately 1.0 $\mu$m. The upward diffusion of the buried p-type zone was approximately 5 $\mu$m, measured from the interface between the substrate and the epitaxial layer, so that the distance between the n-type contact zone 4 and the p-type zone 2 was approximately 3 $\mu$m.

The diode can be used, for example, as a protection diode in an integrated circuit, for example between the power supply (cathode) and ground (anode). When a voltage is applied across the diode in the forward direction, the pn-junction 12 between the regions 2 and 3 becomes forward biased and injects electrons into the p-type region 2. Electrons diffusing through the p-type region 2 are collected by the n-type region 1 and are at least largely discharged as a diode current via the terminal 10. Since no more than a small part of the injected electrons will reach the substrate 6, such diodes are also referred to as "low leakage diodes". When the diode is reverse-biased, the electric field strength will be largest, at least in the absence of electric current, at the pn-junction 12 between the p-type buried layer 2 and the n-type region 3. When current starts to flow between the regions 2 and 3 as a result of breakdown, the pn-junction between region 1 and region 2 becomes forward-biased. The resultant current causes the maximum of the electric field to shift from the pn-junction 12 to the contact zone 4 as a result of the Kirk effect caused by the electron-current density. The field is largest at the curvature 13 of the contact zone 4, so that the breakdown voltage becomes lower at this location. As a result of the lower breakdown voltage, the current becomes larger, so that the junction between the regions 1 and 2 becomes more forward-biased which, in turn, leads to a further reduction of the breakdown voltage. This may result in a large current flow which can damage the diode.

FIG. 2 is a sectional view of a diode in accordance with the invention, wherein, for clarity, corresponding parts bear the same reference numerals as in FIG. 1. The device shown in FIG. 2 differs mainly from that shown in FIG. 1 in that it comprises a heavily doped n-type ring 14 around the contact zone 4. The distance between the ring 14 and the contact zone 4 was approximately 2 $\mu$m in a specific embodiment. As this is the size of the mask, this means that tails of the diffusion profiles of the zones 4 and 14, which are drawn separately in FIG. 2, may partly overlap as a result of lateral diffusion. Also in that case, however, the zones 4 and 14 are assumed to be mutually separated by intermediate high-impedance material. It is important that the zone 14 is not directly connected to a contact or to contact 11. As the zone 14 is near the zone 4, the application of a voltage in the reverse direction across the diode, will cause the maximum electric field to be situated at curvature 15 of ring 14. Breakdown will not occur at the zone 4, as in the embodiment shown in FIG. 1, but at the zone 14. The arc-shaped region 16 between the ring 14 and the zone 4 forms a resistance between the region 15 and the contact 11, and it precludes local damage to the diode caused by avalanche effects and current concentration. As a result, the diode shown in FIG. 2 is much more robust than the diode shown in FIG. 1, and hence particularly suitable as a protection against ESD. Measurements (FIG. 3) have shown that the diode can withstand voltages of many kV for ESD protection (Human body model) without being damaged. In comparison, diodes without a protection ring 14 already were subject to damage at a voltage of approximately 1.5 kV.

The zone 14 can be provided at the same time as the zone 4 without additional process steps. In addition, the zone 14 requires little additional space, so that the surface area of the device increases little, or not at all.

Figure 3:
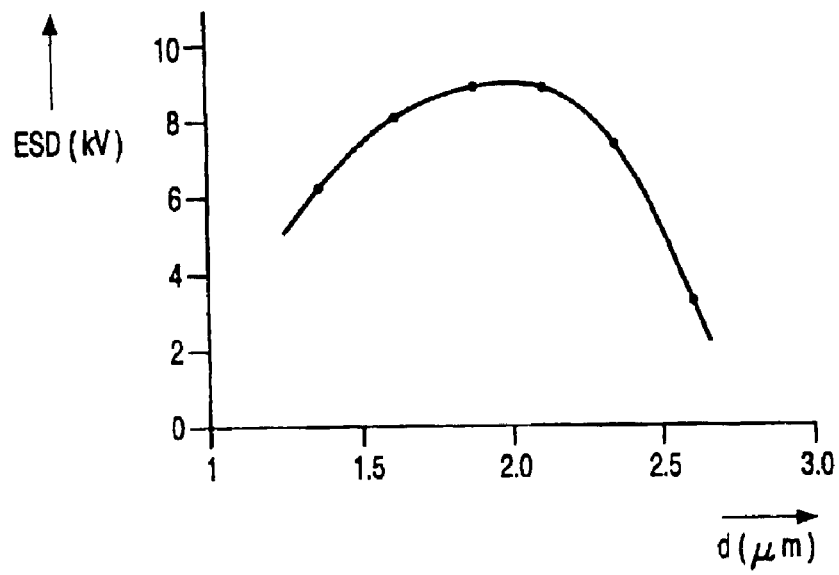
FIG. 3 graphically shows the effect of the distance between the protection zone and the contact zone, in the embodiment shown in FIG. 2 on the ESD strength.

An important parameter is the distance between the contact zone 4 and the protection zone 14. FIG. 3 shows the relation between the ESD voltage in kV at which a predetermined percentage of a large number of diodes is subject to damage and the distance d in $\mu$m between the ring 14 and the contact zone 4. The optimum is found at approximately 2 $\mu$m. If the distance d becomes smaller than 1.5 $\mu$m, the effect is reduced, apparently because the resistance becomes too low. Above approximately 2.5 $\mu$m, the advantage of the protection zone also decreases rapidly as d increases because, above a certain distance, the same effects as in the device shown in FIG. 1 start playing a role.

Figure 4:
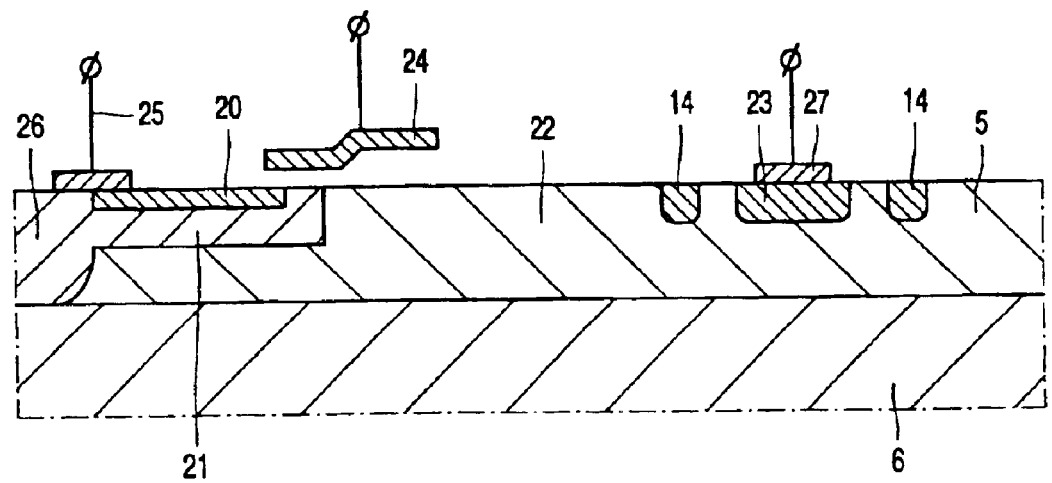
FIG. 4 is a sectional view of a further embodiment of a semiconductor device in accordance with the invention.

Apart from diodes, the invention can also advantageously be used in other types of circuit elements. FIG. 4 is a sectional view of a device in accordance with the invention comprising a Lateral DMOS transistor. Also in this case, the device comprises a semiconductor body 1 of silicon including a p-type substrate 6 on which an n-type epitaxial layer 5 is provided. The transistor comprises an n-type source 20 (first region) situated in a p-type backgate 21 (second region). Said backgate region borders on a high-impedance n-type drift region 22 (third region) which is formed by part of the epitaxial layer 5 and which blends with a heavily doped n-type drain 23 (fourth region) at the side opposite the backgate region. Above the part of the backgate region 21 which is situated between the source 20 and the drift region 21, an insulated gate 24 is provided. The source is connected to a source contact 25 which, in this example, is also connected to the backgate region 21. Via a deep p-type zone 26, the backgate region is also connected, in this example, to the substrate 6 (ground), but it will be clear that this is not strictly necessary. The drain is connected to a drain contact 27. Between the drain 23 and the backgate region 21, and in this example on either side of the drain 23, a heavily doped n-type protection zone 14 is provided. Also in this case, the zone 14 is situated at a small distance, for example 2 μm, from the drain 23 and can be formed, also in this case, during the same process steps as drain 23. When a high-voltage is applied between the drain 23 and the backgate region 21 and/or the substrate 6, and, as a result of the Kirk effect, at a large current, the maximum of the field moves over the non-conductive pn-junction towards the drain 23, breakdown will initially occur again at the protection zone 14, and the resistance between the zone 14 and the terminal 27 precludes current concentration, and hence reduces the risk of damage to the device.

It will be obvious that the invention is not limited to the examples given herein, and that, within the scope of the invention, many variations are possible to those skilled in the art. For example, in the last-mentioned example, the p-type substrate 6 may be replaced with a substrate of an electrically insulating material. Embodiments wherein the protection zone is not annularly provided around the zone 4, as shown in FIG. 2, but wherein the protection zone extends only next to the part of the contact zone 4 where, in the absence of the zone 14, breakdown caused by the Kirk effect may be expected are possible. The thickness and the doping concentration of the lightly doped third region, for example the drift region of the LDMOST in accordance with FIG. 4, may be advantageously chosen so as to correspond to the RESURF principle.

Furthermore, in the examples described hereinabove, the conductivity types may be reversed. In addition, the semiconductor body may be composed of materials other than silicon.

What is claimed is:

1. A semiconductor structure, comprising:
    a substrate of a first conductivity type;
    a first buried layer of a second conductivity type disposed on the substrate;
    a second buried layer of the first conductivity type disposed on the first buried layer, and separated from the substrate by the first buried layer;
    an epitaxial region of the second conductivity type having a bottom surface disposed on the second buried layer, and further having a top surface;
    a first deep via disposed through the epitaxial region such that a first electrical pathway is formed from the top surface of the epitaxial region to the first buried layer;
    a second deep via disposed through the epitaxial region such that a second electrical pathway is formed from the top surface of the epitaxial region to the second buried layer;
    a contact region of the second conductivity type disposed in the epitaxial region, the contact region having a top surface that is coplanar with the top surface of the epitaxial region; and
    a protection region of the second conductivity type disposed in the epitaxial region, the protection region having a top surface that is coplanar with the top surface of the epitaxial region, and the protection region spaced apart from the contact region, and spaced apart from the first and second deep vias,
    wherein the contact region and the protection region each have a greater doping concentration than the epitaxial region; and
    wherein the protection region comprises a ring around the contact region.

2. The semiconductor structure of claim 1, wherein the first deep via and the second deep via are electrically coupled.

3. The semiconductor structure of claim 2, wherein the first deep via and the second deep via are spaced apart from each other.

4. The semiconductor structure of claim 3, wherein the semiconductor device is of the RESURF type, wherein the product of the thickness and the doping concentration of the epitaxial region is approximately $10^{12}$ atoms per $cm^2$.

5. The semiconductor structure of claim 3, wherein the epitaxial region has a thickness of approximately 9 μm, and a doping concentration of $3.5 \times 10^{15}$ atoms per $cm^3$.

6. The semiconductor structure of claim 3, wherein the first deep via and the second deep via are electrically coupled by a terminal disposed outside of the epitaxial layer.

7. The semiconductor structure of claim 3, wherein the first conductivity type is p-type and the second conductivity type is n-type.

8. A semiconductor structure, comprising:
    a substrate of a first conductivity type;
    an epitaxial layer of a second conductivity type disposed on the substrate;
    a drain region of the second conductivity type disposed in the epitaxial layer;
    a protection region of the second conductivity type disposed in the epitaxial layer, spaced apart from the drain region, and comprising a ring around the drain region;
    a backgate region of the first conductivity type disposed in the epitaxial layer, and spaced apart from both the protection region and the substrate;
    a source region of the second conductivity type disposed in the backgate region;
    a deep via of the first conductivity type disposed in the epitaxial layer, the deep via providing an electrical connection between the backgate region and the substrate;
    wherein the drain region and the protection region each have a doping concentration that is higher than the doping concentration of the epitaxial layer.

9. The semiconductor structure of claim 8, further comprising a gate electrode disposed above the source region and the epitaxial layer, and electrically insulated from the source and epitaxial layer.

10. The semiconductor structure of claim 8, wherein the first conductivity type is p-type and the second conductivity type is n-type.

* * * * *